(12) United States Patent
Huang

(10) Patent No.: US 6,437,399 B1
(45) Date of Patent: *Aug. 20, 2002

(54) SEMICONDUCTOR STRUCTURES WITH TRENCH CONTACTS

(75) Inventor: Qin Huang, Blacksburg, VA (US)

(73) Assignee: Fairchild Semiconductor Corporation, South Portland, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/498,476

(22) Filed: Feb. 4, 2000

Related U.S. Application Data

(62) Division of application No. 08/885,922, filed on Jun. 30, 1997, now Pat. No. 6,037,628.

(51) Int. Cl.[7] .......................... H01L 29/76; H01L 29/94; H01L 31/062; H01L 31/113

(52) U.S. Cl. ........................ 257/329; 257/330; 257/331; 257/377

(58) Field of Search ............................... 257/377, 329, 257/330, 331, 332, 328, 346

(56) References Cited

U.S. PATENT DOCUMENTS 5,719,409 A * 2/1998 Singh et al. .................. 257/77
6,037,628 A * 3/2000 Huang ......................... 257/329

* cited by examiner

Primary Examiner—Tom Thomas
Assistant Examiner—Douglas W. Owens
(74) Attorney, Agent, or Firm—Thomas R. FitzGerald

(57) ABSTRACT

Semiconductor structures such as the trench and planar MOSFETs (UMOS), trench and planar IGBTs and trench MCTs using trenches to establish a conductor. Improved control of the parasitic transistor in the trench MOSFET is also achieved and cell size and pitch is reduced relative to conventional structures.

15 Claims, 5 Drawing Sheets

SEMICONDUCTOR STRUCTURES WITH TRENCH CONTACTS

This is a division, of application Ser. No. 08/885,922, filed Jun. 30, 1997 now U.S. Pat. No. 6,037,628.

BACKGROUND OF THE INVENTION

The present invention relates to semiconductor devices such as MOSFETs using trenches to establish electrical contact.

The conventional trench process for forming MOSFETs uses a total of six masks; i.e., 1. a first mask for defining a buried layer region in a semiconductor;
2. a second mask for defining an active area;
3. a source mask for source implantation;
4. a trench mask for defining the trench of etching and filling;
5. a contact mask to define the areas of contacts; and
6. a metal mask.

This process results in a relatively deep junction, wider cell pitch, wider source width and a stronger parasitic transistor problem.

Accordingly, it is an object of the present invention to provide a novel semiconductor structure made by a process which uses fewer masks.

It is another object of the present invention to provide a novel trench contact structure where the buried layer may selectively be controlled and made deeper than the depth of the trench gate.

It is yet another object of the present invention to provide novel structures for both trench and planar devices.

These and many other objects and advantages of the present invention will be readily apparent to one skilled in the art to which the invention pertains from a perusal.of the claims, the appended drawings, and the following detailed description of the preferred embodiments.

DESCRIPTION OF PREFERRED EMBODIMENTS

The novel process of the present invention will be illustrated in connection with a P channel MOSFET, but it is to be understood that the process is equally applicable to N channel MOSFETs and to other semiconductor structures.

Figure 1:
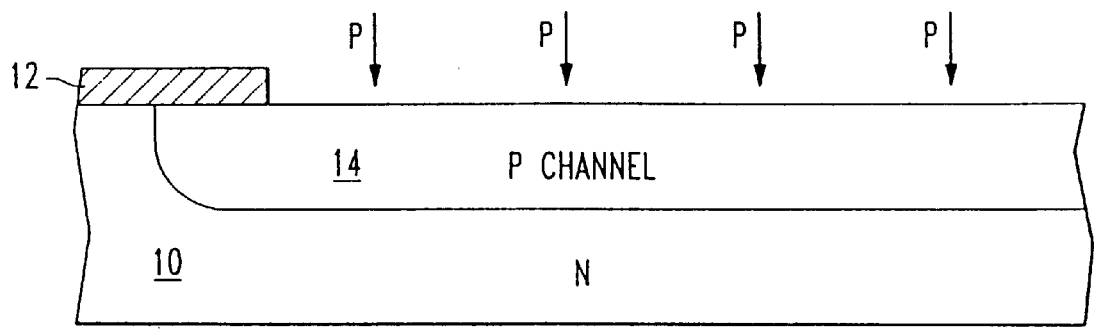
FIGS. 1–9 illustrate the sequence of steps in the novel process of the present invention.

With reference to FIG. 1, the surface of a N type semiconductor wafer 10 is masked by a conventional mask 12 to define an active region, and a P type impurity is implanted in a conventional manner and driven, e.q., by annealing, to form a P channel region 14A. The region of P type impurity 14, generally referred to as the base region, is herein referred to as the channel region because it is the region in which the channel forms during the operation of the device.

Figure 2:
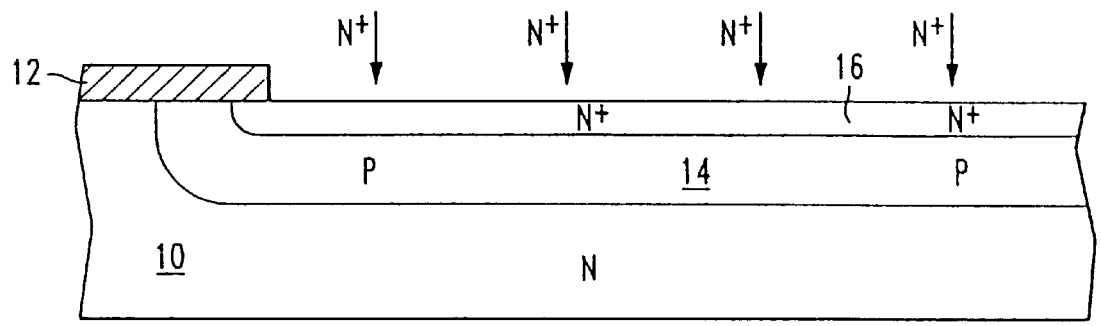

As shown in FIG. 2, a N type polarity impurity may then be implanted and driven into the channel area 14 to form a N+ source region 16 adjacent the surface of the wafer.

Figure 3:
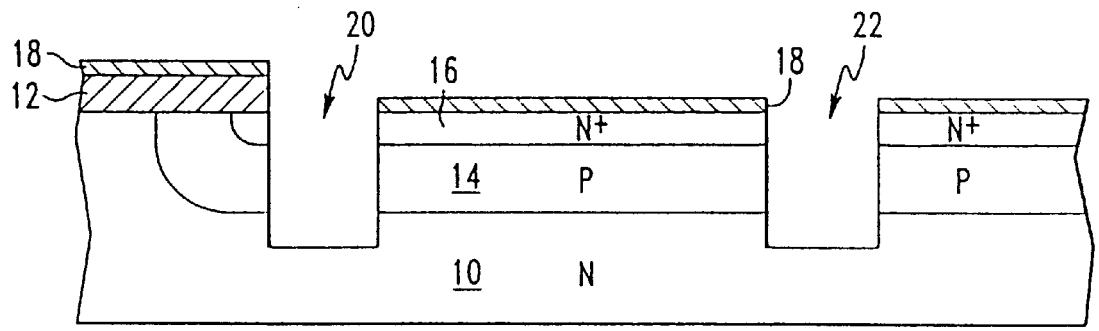

A second conventional mask 18 may then be used as shown in FIG. 3 to define the area for two trenches 20, 22. The trenches 20,22 may then be etched in a suitable conventional manner downwardly through the N+ source region 16 and the P channel region 14 into N wafer.

Figure 4:
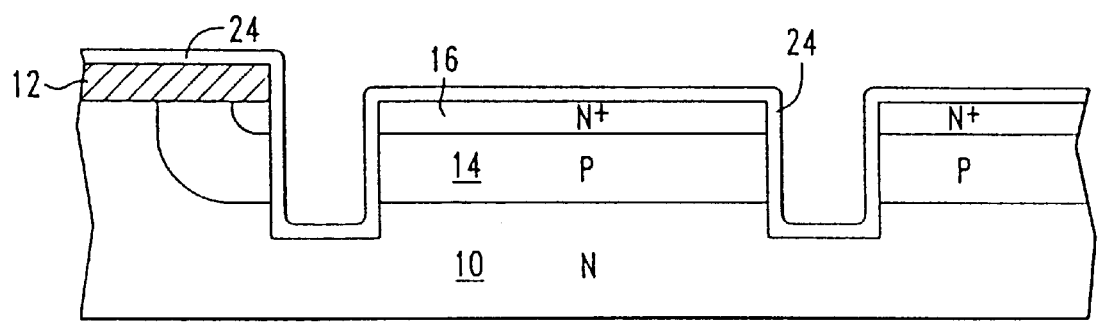

The second mask 18 of FIG. 3 may then be removed and a gate oxide layer 24 over all of the exposed upper surface of the semiconductor including the walls and bottom of the trenches 20,22 as shown in FIG. 4.

Figure 5:
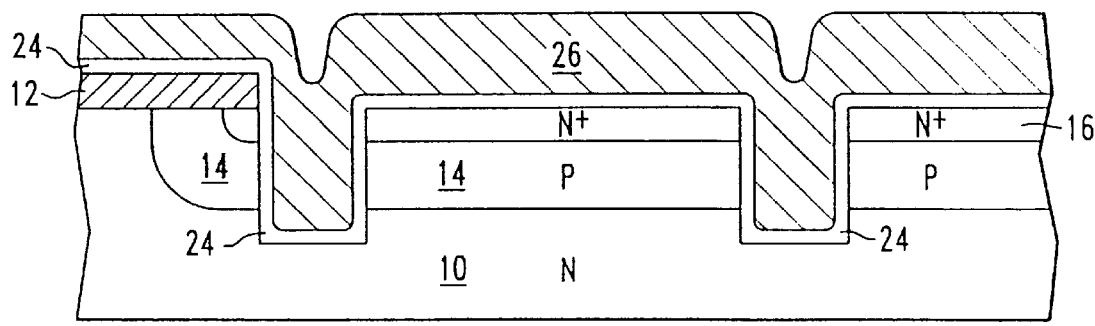

As shown in FIG. 5, a layer of polysilicon 26 may conventionally be provided over the gate oxide later 24, completely filling the trenches 20,22.

Figure 6:
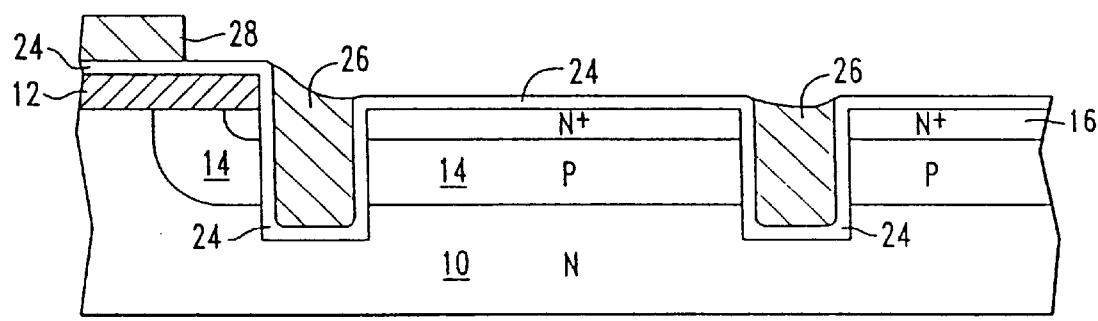

As shown in FIG. 6, a third mask 28 may then be provided to define an area larger than the active region defined by the mask 12 to protect the polysilicon layer 26 for establishing a contact at a later time. Thereafter, the polysilicon layer 26 left unprotected by the mask 28 may be etched back to leave polysilicon 26 only in the trenches 20,22.

Figure 7:
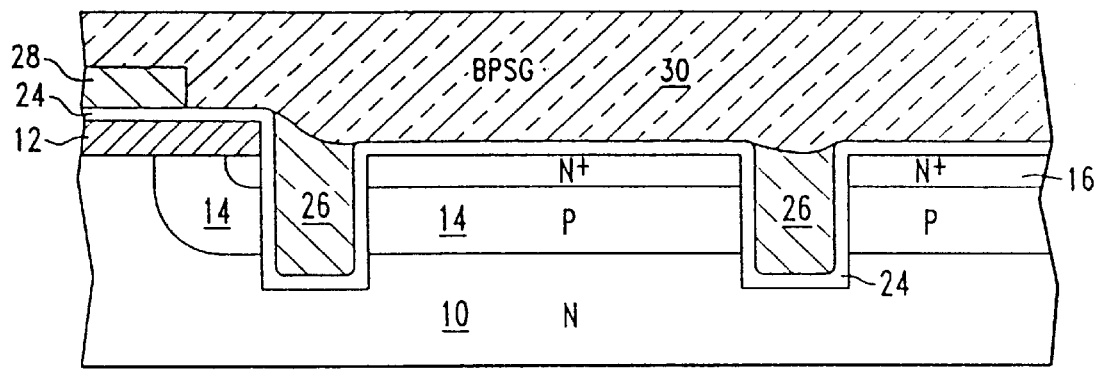
Figure 8:
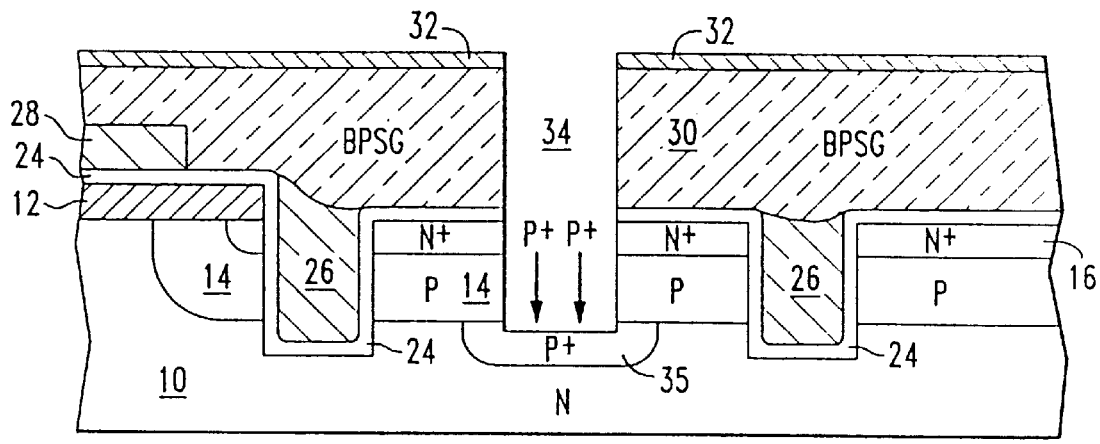

A layer of borophosphosilicate glass ("BPSG") 30 may then be formed over the surface of the semiconductor as shown in FIG. 7, and, as shown in FIG. 8; a fourth mask 32 may be conventionally formed over the BPSG layer 30 to thereby define the a area for a third trench 34 which may be etched through the BPSG layer 30, the gate oxide 24, the N+ source 16, and the P channel area 14 into the N semiconductor 10..Once the trench 34 has been etched, a P type impurity may be implanted and driven into the N wafer to thereby form a P+ area 35 of higher impurity concentration than the P channel region 14.

Figure 9:
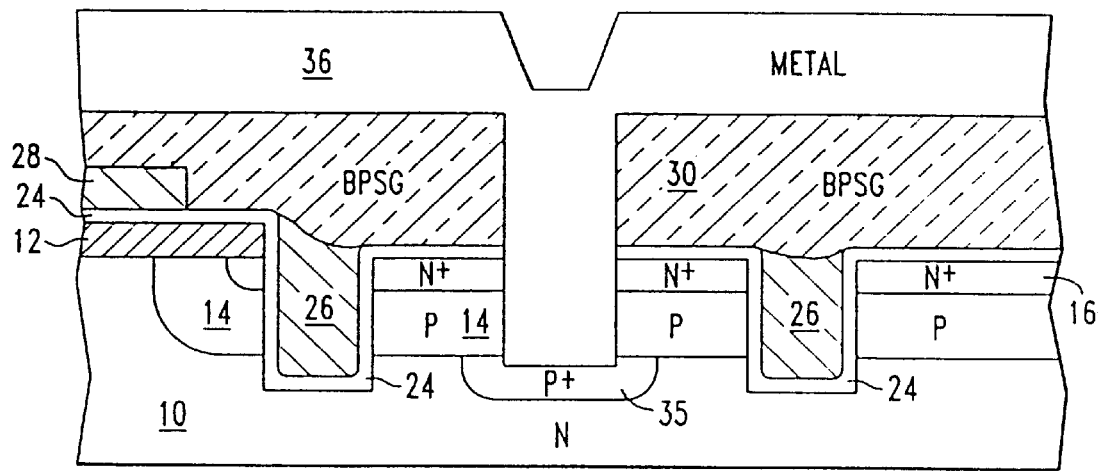

As illustrated in FIG. 9, a metal layer 36 may then be formed over both the BPSG area 30 to thereby establish a contact with the N+ source region and the P+ high concentration region 35 at the bottom of the trench 34 of FIG. 8.

The four mask trench process of the present invention eliminates two masks used in the prior art process, i.e., the P+ mask and the source block mask, and it makes alignment easier to achieve, i.e., the only alignment required is the contact to the trench.

Figure 10:
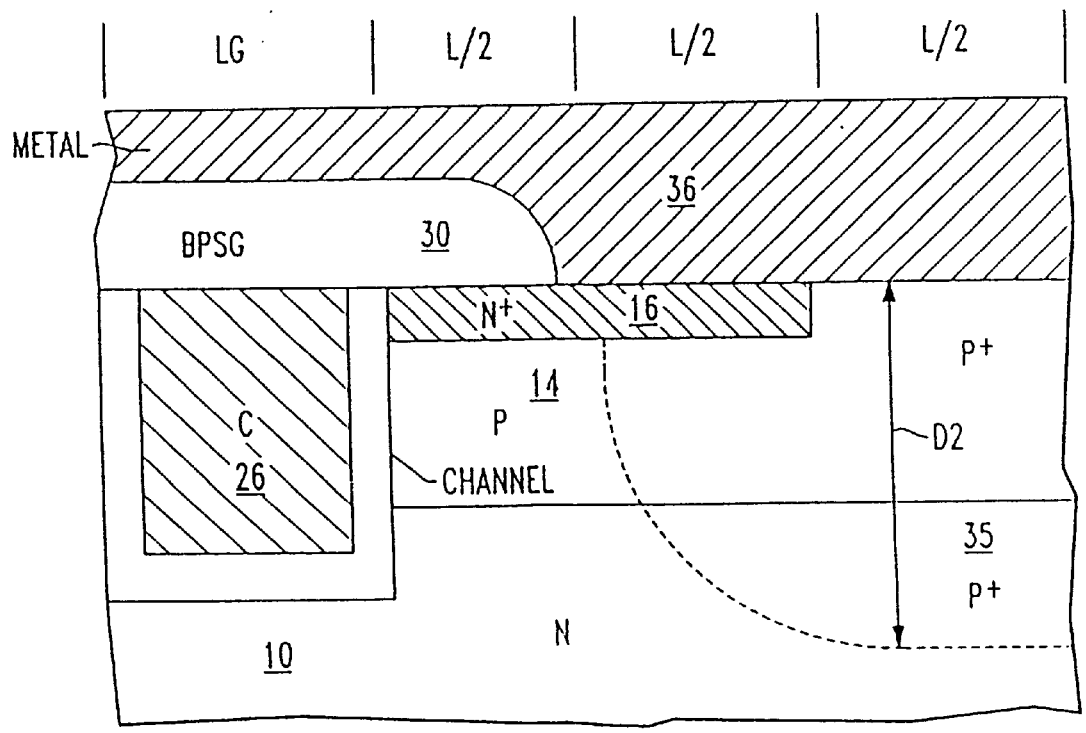
FIG. 10 illustrates the structure which results from the conventional trench process.

The six mask process of the prior art process results in a structure as shown in FIG. 10 and provides a ready contrast with the structure of the present trench process.

In the prior art structure of FIG. 10, the cell pitch is equal to the length of the gate ("LG") plus three time the length of the design rule value ("L") and the width of the source is equal to L.

Figure 11:
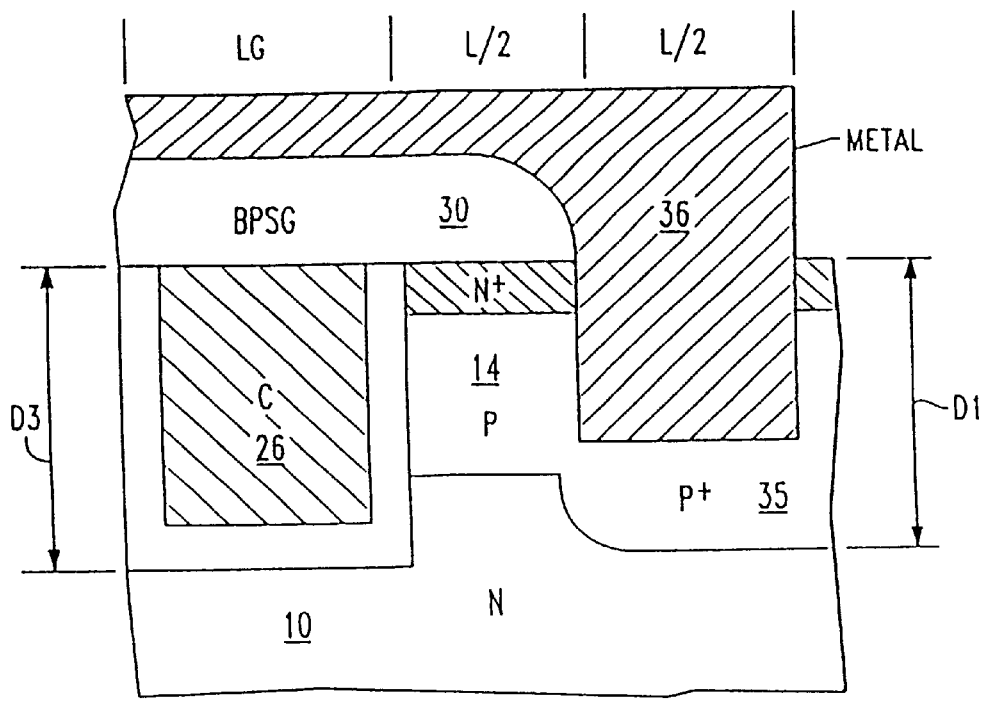
FIG. 11 illustrates the novel structure which results from the trench process of the present invention.
Figure 12:
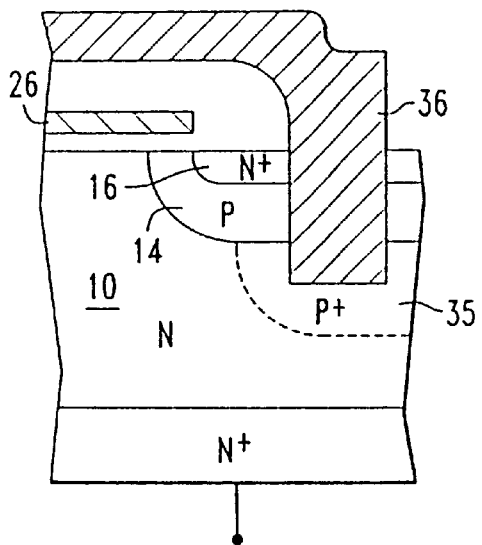
FIG. 12 illustrates the novel structure of the present invention embodied in a planar MOSFET.
Figure 13:
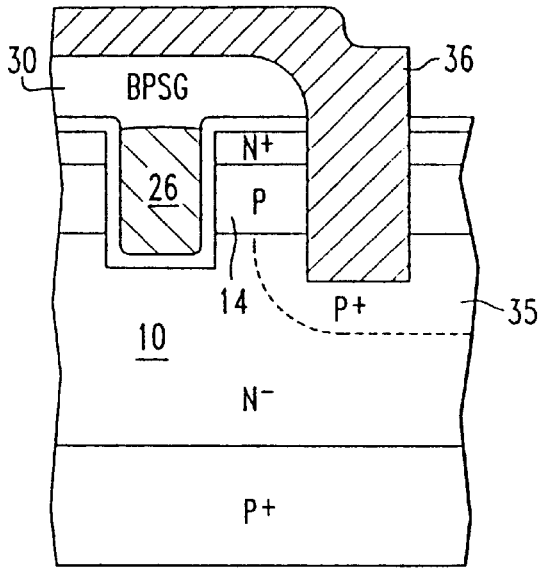
FIG. 13 illustrates the novel structure of the present invention embodied in a trench insulated gate bipolar transistor ("IGBT").
Figure 14:
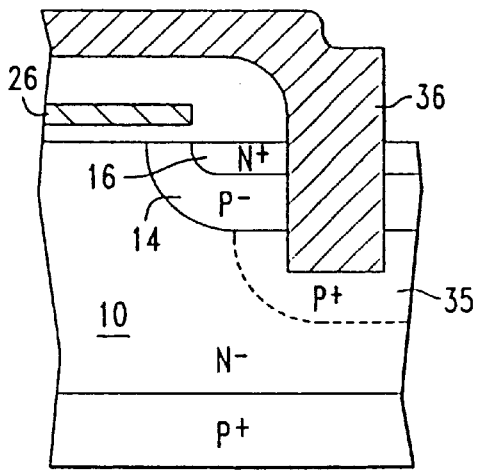
FIG. 14 illustrates the novel structure of the present invention embodied in a planar IGBT.

In contrast, the structure of FIG. 11 provides a cell pitch of LG plus 2L, a saving of L and the width of the source is reduced to L/2. In addition, the depth D1 of the P+ high concentration area or buried layer 35 may be significantly reduced below the depth D2 in FIG. 10 because the depth D2 is necessitated to achieve the lateral diffusion of the P+ implant under the source 16. Because of the impact of the lateral diffusion on the channel 14, the length of the source, and thus the design rule value L, negatively impacts on the pitch of the device. Because the length of the source 16 is reduced in FIG. 11, it is possible to reduce the design rule value L and the pitch.

Additionally, the depth D1 of the buried layer 35 in FIG. 11 may be greater than the depth D3 of the trench gates 20,22, making it possible for the MOSFET to break down at the PN junction 35 and protect the trench gate 26.

Figure 15:
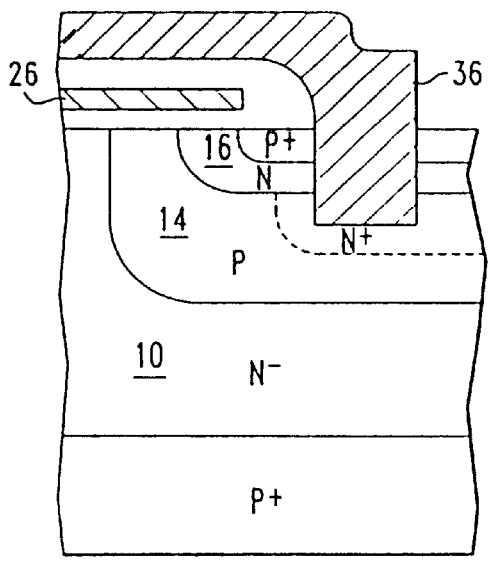
FIG. 15 illustrates the novel structure of the present invention embodied in a planar MCT.

With reference to FIGS. 12–15 in which like numerical references have been retained with the structures of FIGS. 10 and 11 to facilitate a comparison therewith, the present invention may be embodied in a planar MOSFET (FIG. 12), a trench IGBT (FIG. 13), a planar IGBT (FIG. 14) and a planar MCT (FIG. 15).

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A FET semiconductor structure comprising:
    a polysilicon filled trench lined with a gate oxide bounding a source region, said source region overlying and in contact with a channel region;
    a metal filled trench in contact with both the source and channel regions, wherein the metal filled trench extends downwardly to a trench floor disposed within the channel region so that the only substantial contact of the metal filled trench with the channel region is along a vertical boundary of said channel region; and
    a region having a higher impurity concentration than the channel region, said region with the higher impurity concentration lying substantially directly beneath and in contact with the floor of the metal filled trench and extending laterally to merge with an adjoining portion of the channel region.

2. The semiconductor structure of claim 1 wherein the metal filled trench is laterally spaced from the polysilicon filled trench.

3. The semiconductor structure of claim 2 wherein the metal filled trench is shallower than the polysilicon filled trench.

4. The semiconductor structure of claim 1 wherein the region having a higher impurity region than the channel region extends to a depth at least substantially equal to the depth of the polysilicon filled trench.

5. The semiconductor structure of claim 4 wherein the region having a higher impurity region than the channel region extends to a depth greater than the depth of the polysilicon filled trench.

6. The semiconductor structure of claim 1 wherein the source and channel regions form a substantially horizontal PN junction.

7. The semiconductor structure of claim 1 further comprising an insulating layer overlying the polysilicon filled trench.

8. The semiconductor structure of claim 7 wherein the insulating layer comprises borophosphosilicate glass.

9. The semiconductor structure of claim 1 embodied in a trench IGBT.

10. A FET semiconductor structure comprising:
    a wafer comprising a polysilicon filled trench lined with a gate oxide bounding a source region, said source region overlying and in contact with a channel region, said channel region overlying and bordering a region of high impurity concentration so that there is a material area of contact between said channel region and said region of high impurity concentration; and
    a metal filled trench in contact with both the source and channel regions, wherein the metal filled trench has areas of contact with the source and channel regions that are generally coplanar with one another, and wherein the metal filled trench extends downwardly into the wafer into contact with the channel region rather than laterally along the wafer surface into contact with the channel region so that the only substantial contact of the metal filled trench with the channel region is along a vertical boundary of said channel region.

11. A semiconductor structure comprising:
    a wafer containing a horizontally disposed gate, said gate bounding a source region, said source region overlying and in contact with a channel region, said channel region overlying and bordering a region of high impurity concentration so that there is a material area of contact between said channel region and said region of high impurity concentration; and
    a metal having areas of contact along vertical boundaries of both the source and channel regions, said areas of contact with said source and channel regions being generally coplanar with one another, said metal extending vertically into said wafer to contact said region of high impurity concentration.

12. The semiconductor structure of claim 11 embodied in a planar MOSFET.

13. The semiconductor structure of claim 11 embodied in a planar IGBT.

14. The semiconductor structure of claim 11 embodied in a planar MCT.

15. The semiconductor structure of claim 11 wherein said metal comprises a vertical metal filled trench disposed substantially above said region of high impurity concentration.

* * * * *